United States Patent [19]
Jackson

[11] Patent Number: 5,814,561
[45] Date of Patent: Sep. 29, 1998

[54] SUBSTRATE CARRIER HAVING A STREAMLINED SHAPE AND METHOD FOR THIN FILM FORMATION

[76] Inventor: Paul D. Jackson, 5014 E. Desert Park La., Paradise Valley, Ariz. 85253

[21] Appl. No.: 799,871

[22] Filed: Feb. 14, 1997

[51] Int. Cl.$^6$ .................................................. H01L 21/44
[52] U.S. Cl. ......................... 438/680; 118/500; 118/728
[58] Field of Search ...................... 118/728, 500; 428/248.1; 438/680

[56] References Cited

U.S. PATENT DOCUMENTS

| | | | |
|---|---|---|---|
| 5,403,401 | 4/1995 | Haafkens et al. | 118/728 |
| 5,599,397 | 2/1997 | Anderson et al. | 118/728 |
| 5,679,159 | 10/1997 | Olsen | 118/500 |

*Primary Examiner*—Charles L. Bowers, Jr.
*Assistant Examiner*—Renee R. Berry

[57] ABSTRACT

A structure for chemical vapor deposition processing includes a substrate carrier (10) having a streamlined shape. When placed in a mainstream flow (21), the substrate carrier (10) maintains a laminar boundary layer over a substrate (17) under high gas flow rate conditions. In a further embodiment, the substrate carrier (10) includes a device (27) for directly injecting a reactant gas stream (33) into the boundary layer.

23 Claims, 4 Drawing Sheets

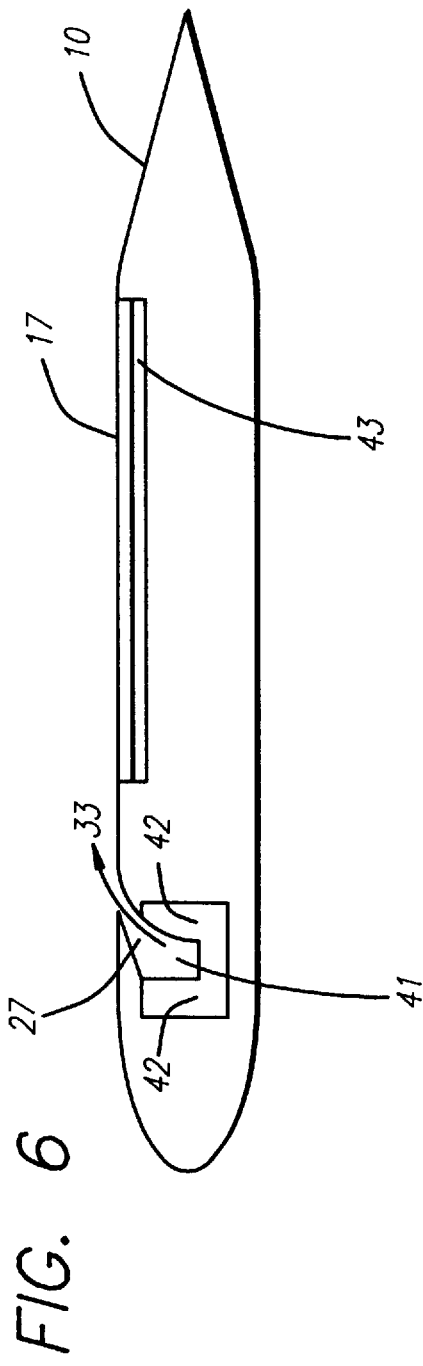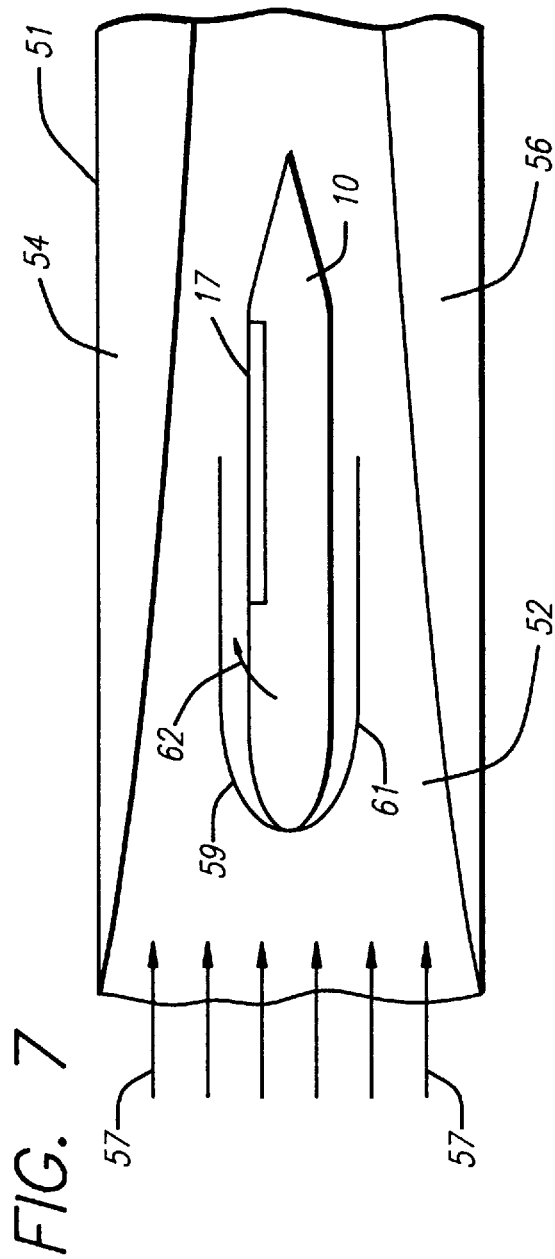

5,814,561

SUBSTRATE CARRIER HAVING A STREAMLINED SHAPE AND METHOD FOR THIN FILM FORMATION

BACKGROUND OF THE INVENTION

This invention relates, in general, to semiconductor wafer processing, and more particularly, to methods and structures for thin film formation.

Chemical vapor deposition (CVD) is a very versatile and widely used process in the semiconductor industry to form thin films on semiconductor and insulating substrates. Such thin films include insulative, semiconductive, and conductive materials. CVD is defined as the formation of a non-volatile solid film on a substrate by the reaction of vapor phase chemicals (reactants) that contain the necessary constituents. The reactant gases are introduced into a reaction chamber and subsequently decomposed and reacted at a heated surface to form the thin film.

Current CVD reactor designs all share the same basic components including a reaction chamber, a substrate support structure (i.e., a susceptor), an energy source, gas sources, and devices for controlling gas flow, pressure, and temperature. In a typical CVD process, the following steps occur: a) a given composition of (and flow rate of) reactant gases and diluent carrier gases is introduced into the reaction chamber; b) the gas species move to the substrate; c) the reactants are absorbed on the substrate; d) the absorbed reactants undergo migration and film-forming chemical reactions; and e) the gaseous by-products of the reactions are desorbed and removed from the reaction chamber.

In view of the above steps, the gas flow characteristics within the reaction chamber significantly affect a CVD process and reactor performance. For example, in current CVD reactor designs, turbulence in the flow of reaction gases caused by reactor chamber geometrical constraints as well as current susceptor designs inhibit efficiency and uniformity of the deposition process and promotes the deposition and migration of contaminants within the reaction chamber. Moreover, existing designs are such that gas flow characteristics are indeterminate (i.e., difficult to predict) due to geometrical constraints, flow introduction methods, and susceptor motion.

In addition to using inefficiently designed reactors, CVD process users typically place the wafers to be processed in regions of the reaction chamber where non-uniform flow velocities exist. Also, CVD process users tend to place the substrates in regions of the reaction chamber where interactions with boundary layers formed at the reaction chamber wall occur. Moreover, some CVD reactor designs spin the substrate(s) while the CVD process takes place thereby creating turbulence and spiral vortices. The above practices contribute to turbulence, particle generation, thicker boundary layers, and lower mass transport.

Furthermore, current CVD reactors introduce both the source gases and the carrier gas as mainstream gases well upstream from the substrates. This creates an inefficient and costly deposition process because excess source gases must be introduced into the reactor chamber to assure that sufficient reactants reach the substrates. This also degrades process control.

Based on the above and other deficiencies associated with the prior art, structures and methods are needed for improving gas flow characteristics and reactor efficiency in CVD processing.

BRIEF DESCRIPTION OF THE DRAWINGS

FIG. 6 is a cross-sectional view of a substrate carrier according to the present invention;

FIG. 7 is a side view of a reactor chamber including a substrate carrier according to the present invention to illustrate a preferred carrier placement.

DETAILED DESCRIPTION OF THE DRAWINGS

Figure 1:
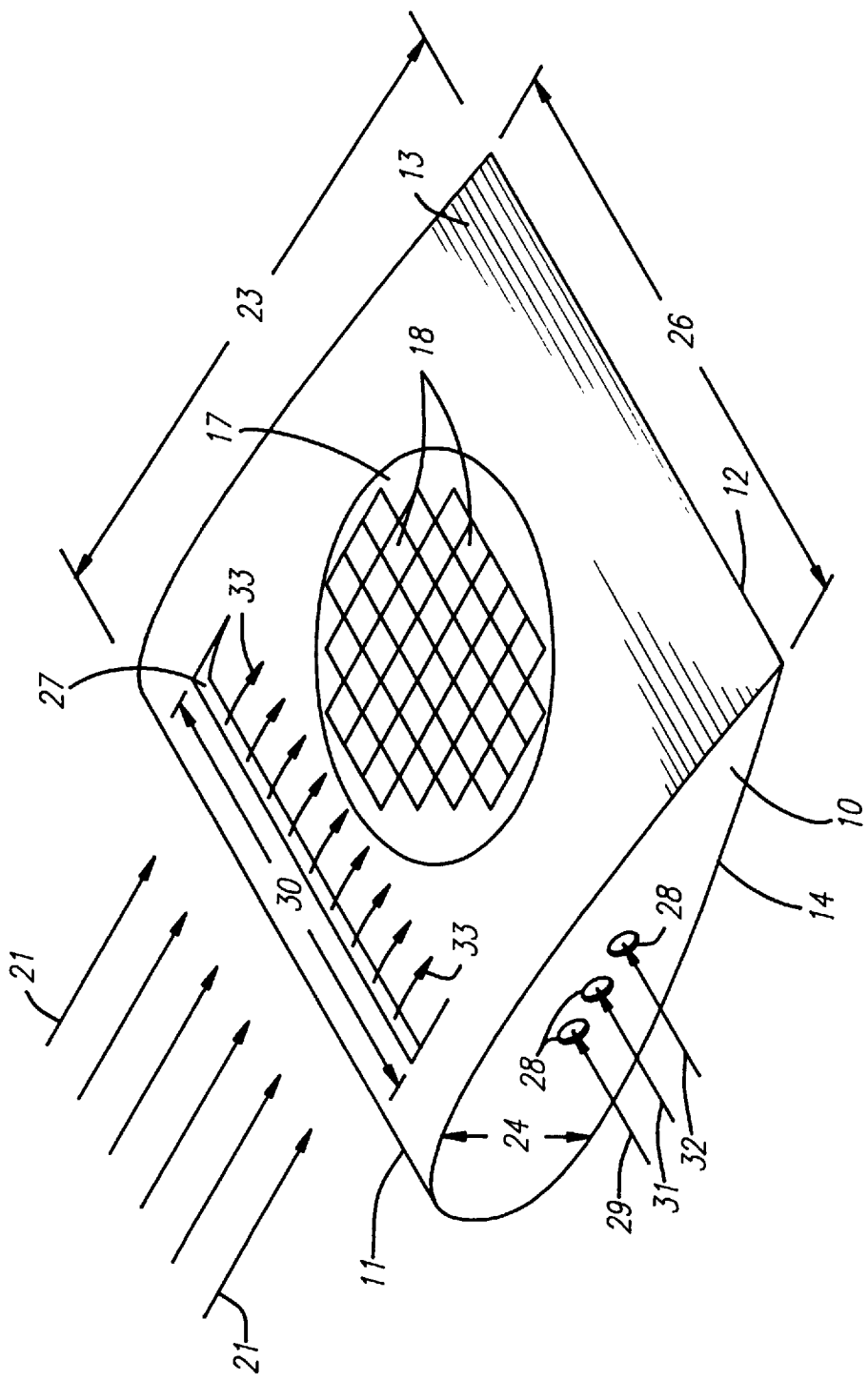
FIG. 1 illustrates an isometric view of a substrate carrier according to the present invention.

In general, the present invention relates to structures and methods for forming thin films on substrates. More particularly, the present invention utilizes a substrate carrier structure having a streamlined or non-bluff shape, which allows for higher gas flow rates while maintaining laminar flow characteristics during a deposition process. The high flow rate/laminar flow effect results in, among other things, enhanced mass transfer characteristics, thinner boundary layers, and enhanced process control. In an alternative embodiment, the substrate carrier structure includes a device for directly injecting reactant species into the boundary layer for enhanced process control. Such control allows CVD process users to achieve thin films with very precise chemistries and film characteristics (e.g., thickness, stress, etc.). In a still further embodiment, the substrate carrier structure is placed in an inviscid core region of the reactor chamber to take advantage of uniform flow velocity.

According to conventional fluid mechanics theory, fluid dynamic flows typically are treated as either internal or external flows. In current CVD reactors, the flow dynamics generally have been characterized using internal flow methods. An internal flow is one that is constrained by bounding walls (typically assumed to be a long tube, pipe or duct) where viscous effects grow, meet, and permeate the entire flow. At this point, the flow is said to be fully developed and viscous shear in the flow is the dominate characteristic. The characteristics of internal flows are generally covered under the topic of viscous flow in ducts in the fluid mechanics literature.

An external flow is an unbounded flow around a body or object immersed in a fluid stream. Such flows have viscous effects near the body, but typically are inviscid away from the body or object. The characteristics of external flows are generally studied under the topic of boundary layer flows in the fluid mechanics literature.

Viscous flows are further characterized as being laminar or turbulent. Laminar flow generally is smooth and steady while turbulent flow is fluctuating and agitated. In engineering analysis, the dimensionless Reynolds number (Re) is used to partially characterize laminar and turbulent flows. The Reynolds number is primarily a function of the velocity and kinematic viscosity of a particular flow.

The transition from laminar flow to turbulent flow is called the critical Reynolds number ($Re_{crit}$). Flows with Re below the critical number are termed laminar, and flows with Re above the critical number are turbulent with a certain number range just above the critical number where the flow is in transition. For fully developed internal flows where viscous effects predominate, the critical Reynolds number is generally accepted to be in a range between 2000 and 2300.

For external flows where the mainstream flow is inviscid, $Re_{crit}$ is much higher, but generally not unique. The condition of the surface (smooth versus rough) and the state of the free stream can have a significant effect on $Re_{crit}$. The critical Reynolds number for external flows can be on the order of 50,000, but can be as high as 3,000,000. A value of $Re_{crit}=1,000,000$ often is used for analysis purposes.

In addition to the flow velocity and kinematic viscosity, the Reynolds number also depends on a characteritic dimension that is selected based on the type of flow. For internal flows, Re is calculated using the tube or duct diameter as the characteristic dimension (i.e., $Re_D$). If the tube is non-circular in shape, the hydraulic diameter must be determined and used to calculate Re. For external flows, the length of the object parallel to the flow stream typically is used as the characteristic dimension to calculate Re (i.e., $Re_L$).

In CVD processing, boundary layer thickness and mass transport coefficients are two key parameters that are functions of the Reynolds number. For external flows, the boundary layer thickness for laminar flow has been shown to be a function of Re according to the following relationship:

$$\frac{\delta}{x} \approx \frac{5.0}{Re_x^{1/2}} \quad (1)$$

where x is the distance along the characteristic length. In addition, the mass transport coefficient has been shown to be a function of Re according to the following relationship:

$$h_g = \frac{3D_g}{2L} Re_L^{1/2} \quad (2)$$

where $D_g$ is the diffusion coefficient of the active species and L is the characteristic length (e.g., length of the reaction zone). From equations 1 and 2, it is clear that as the Reynolds number increases, the boundary layer decreases and the mass transfer coefficient increases.

Also, it is clear that laminar flow can be maintained at much higher Reynolds numbers in external flows (inviscid) than can be achieved with internal flows. However, current CVD process users have assumed that Re must be maintained below 2000 for all flows in order to achieve laminar flow.

To further reduce turbulence effects resulting from current reactor designs and process practices and to compensate for inefficient gas introduction methods, CVD process users have furthermore resorted to using processes with very low Reynolds numbers (typically on the order of 20 to 100). Such low Reynolds numbers result in reduced mass transfer coefficients and increased boundary layer thickness, which in turn creates a grossly inefficient deposition process.

In view of the foregoing discussion, it would be advantageous to achieve a high Reynolds number CVD process while maintaining laminar flow. One key reason current CVD reactor designs are unable to support high Reynolds number processes is due to the bluff body shape of the substrate carrier or carriers. That is, the carriers have sharp edges and large flat surfaces projecting into or normal to a flow stream. Even under low Reynolds number process conditions (i.e., on the order of 20 to 100), current substrate carrier designs, which have bluff body shapes, tend to inhibit laminar flow and force early transition to turbulent flow. Also, the bluff body designs contribute to turbulence, vortices and particle generation (e.g., contamination) within the reactor chamber. Thus, current substrate carrier designs are not conducive to high Reynolds number flow conditions.

Turning now to the present invention, FIG. 1 illustrates an isometric view of a substrate carrier or susceptor according to the present invention and generally designated as carrier 10. Carrier 10 includes a leading edge 11, a trailing edge 12, a major surface 13 for supporting substrates 17, and a major surface 14 opposite major surface 13. Major surface 13 is curved or curvilinear between leading edge 11 and trailing edge 12 to provide carrier 10 with a streamlined, airfoil, vane, elliptical or wing-like shape or profile. Carrier 10 of the present invention has no sharp edges normal to the gas flow stream before the flow stream reaches substrates 17.

More specifically, carrier 10 has a non-bluff shape with leading edge 11 being rounded, trailing edge 12 being more flat-like or sharp than leading edge 11, and that portion of carrier 10 bounded by major surfaces 13 and 14 has a thickness 24 that varies between leading edge 11 and trailing edge 12. Alternatively, both leading edge 11 and trailing edge 12 may be rounded to provide carrier 10 with an elliptical profile (not shown).

In a preferred embodiment, major surface 13 is substantially continuously curved between leading edge 11 and trailing edge 12, except for a portion (i.e., the substrate positioning portion or reaction zone) of major surface 13 that is substantially flat or nearly flat in order to support substrates 17. In a further embodiment, only a portion of major surface 13 is curved and that portion in proximity to trailing edge 12 is flat, less-curved, or curved in an opposite direction than major surface 13.

In a still further embodiment and as shown in FIG. 1, both major surface 13 and major surface 14 are curved or curvilinear in opposite directions. In an optional embodiment, only major surface 13 is curved and major surface 14 is non-curved or less curved. In an alternative embodiment, major surface 14 is curved in the same direction as major surface 13. Beyond that portion of major surface 13 where substrate 17 is positioned, the shape of major surface 13 is less critical to maintaining laminar flow.

Major surface 13 may include one or more locations (e.g., recessed holders or pockets) for supporting and holding substrates 17 to be processed. Other means may be used to hold substrates 17. In alternative embodiment, major surface 14 also includes means for holding a substrate or substrates to increase process capacity.

Depending on the particular CVD process, substrate 17 may or may not include integrated circuit devices 18. For example, during a blanket epitaxial growth process, substrate 17 typically does not include individual integrated circuit devices. However, in the deposition of a semiconductive material, an insulating material, or a conductive material, substrate 17 may include integrated circuit devices 18.

In order to maintain a more optimum pressure distribution, carrier 10 preferably has a length or chord 23 that is based on a maximum thickness of carrier 10. In particular, length 23 typically is approximately 6 to approximately 8 times greater than the maximum thickness (i.e., the thickness to length ratio is about 1/6 to about 1/8).

Carrier 10 further has a width or span 26 that depends on the number of substrates 17 being processed. For example, carrier 10 is designed to hold one or more substrates 17, preferably side-by-side and spaced apart along width 26. Optionally, substrates 17 are placed along length 23. Carrier 10 typically is tilted during a CVD process to establish a slight leading edge or nose down angle of attack (e.g., about 1 degree to about 4 degrees) with respect to a mainstream gas flow 21.

In a preferred embodiment suitable for processing a single 300 millimeter diameter substrate, length 23 is on the order of 600 millimeters, and width 26 is on the order of 500 millimeters. Carrier 10 comprises a quartz, silicon-carbide coated graphite, a ceramic, or other material that can withstand elevated temperatures, that maintains good planarity, and that has a temperature expansion coefficient close to the material that substrate 17 is comprised of.

One key advantage of carrier 10 is that when placed in mainstream gas flow 21, high Reynolds numbers can be used and laminar flow over substrate 17 maintained because of the shape of carrier 10. By allowing for higher Reynolds numbers (e.g., on the order of $Re_{crit}$=10,000 to 50,000), a very thin laminar boundary layer and enhanced mass transport is achieved. This improves process control, cycle time, and reactor efficiency. Although carrier 10 is especially suitable for high Reynolds number conditions, carrier 10 also is suitable for existing lower Reynolds number processes. Use of the present invention in existing lower Re processes improves control over achieving and maintaining laminar flow characteristics.

In an optional embodiment and as shown in FIG. 1, carrier 10 further includes an opening, device, spanwise slot, or slot 27 for directly injecting one or more reactant species or gases (represented by arrows 33) into a boundary layer established by mainstream flow 21 over carrier 10 and substrate 17. Device 27 is ahead of substrate 17 or between leading edge 11 and substrate 17. Substrate 17 typically is spaced a distance on the order of 25 to 75 millimeters from injection device 27. With a width 38 (shown in FIG. 2) of approximately 0.2 mm to approximately 2 mm, device 27 was found not to disrupt the boundary layer conditions.

In a preferred embodiment, one or more individual reactant species (represented by arrows 29, 31, and 32) are introduced into carrier 10 through ducts 28, mixed within carrier 10 (shown in more detail in FIG. 6) then injected as reactant gas stream 33 through device 27. Preferably, device 27 has a width 30 that is larger than the diameter of substrate 17 and is of uniform cross-sectional area.

Suitable examples for processes using device 27 include using an inert mainstream gas 21 and directly injecting all reactant species through device 27. Alternatively, mainstream gas 21 includes one or more reactant species with or without an inert carrier gas and one or more reactant species is directly injected through device 27.

One key advantage of injection device 27 is that by direct injection, lower amounts of reactant gases in potentially higher concentrations are needed thereby reducing processing costs. Additionally, by directly injecting the reactant species, very tight dopant profile control is achieved because of the rapid start and stop of dopant species flow and because of improved control over residual dopant species within a reactor chamber.

Figure 2:
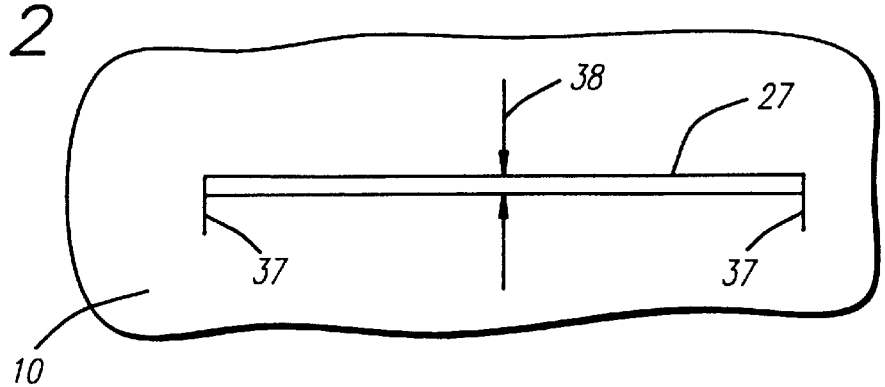
FIGS. 2–5 are plan views of alternate embodiments of a portion of the substrate carrier of FIG. 1.
Figure 3:
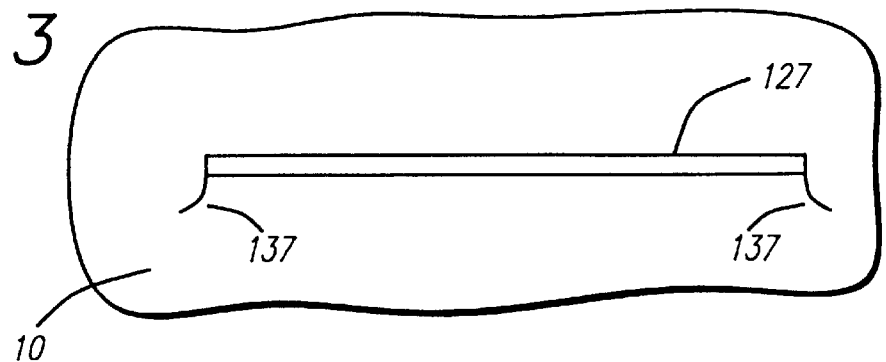
Figure 4:
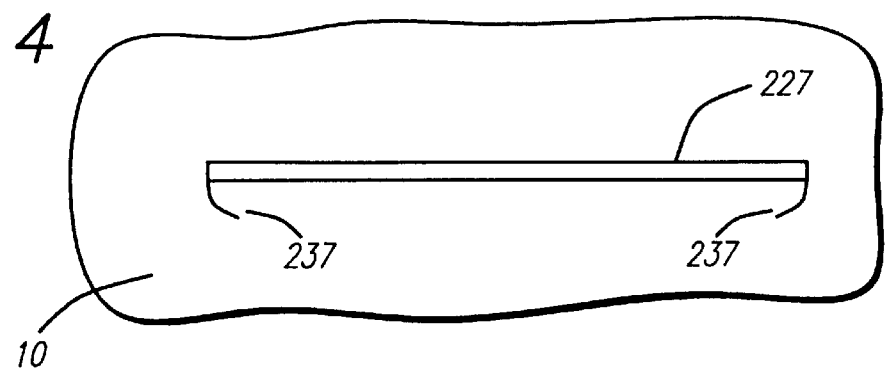

FIGS. 2–4 show plan views of alternative embodiments for the sidewalls of injection device 27. FIG. 2 illustrates device 27 with straight sidewalls 37. FIG. 3 illustrates a injection device 127 with outward curving sidewalls 137. FIG. 4 illustrates a injection device 227 with inward curving sidewalls 237. The sidewall shapes are modified as necessary to reduce slot edge effects (i.e., turbulence) and/or improve coverage over substrate 17.

Figure 5:
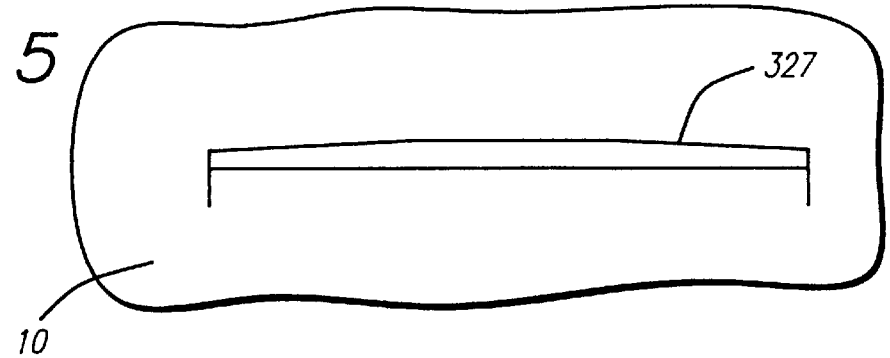

FIG. 5 illustrates an alternative shape for device 27 (shown as device 327). Device 327 has a tailored profile wherein the cross-sectional area is greater in the middle portion of the slot than at the edges. It should be clear that other shapes and sidewall geometries are possible and FIGS. 2–5 are meant only to show examples of preferred embodiments. For example, other injection device shapes include parabolic, triangular, or elliptical shapes.

Also, a series of openings of various shapes (e.g., a plurality of holes) may be used instead of a continuous slot. In addition, device 27 may comprise a series of slots, a porous section, or a series of louvers. Additionally, although device 27 has been shown with carrier 10 having a streamlined or non-bluff shape, device 27 is equally suitable for bluff body carrier designs in lower Reynolds number processes.

FIG. 6 illustrates a cross-sectional view of carrier 10 to show an optional chamber 41, which is coupled to ducts 28 (shown in FIG. 1) when carrier 10 includes a device for directly injecting reactant species. Chamber 41 provides a means for mixing the reactant species before injecting them as reactant gas stream 33 through device 27 over substrate 17.

In a preferred embodiment, a water filled chamber 42 or the like surrounds chamber 41 to prevent the reactant species from depositing onto the walls of chamber 41. Other suitable means for preventing the reactant species from depositing onto walls of chamber 41 may be used. Optionally, the reactant species are mixed externally to carrier 10 and then injected through slot 27.

FIG. 6 further shows a resistive heating element 43 incorporated within carrier 10 to heat substrate 17. Resistive heating element 43 is coupled to an energy source (not shown) to provide energy for heating substrate 17. Alternatively, substrate 17 is heated using conventional radiant, infrared or radio frequency heating techniques.

An interesting characteristic of internal flows, which has been heretofore overlooked in CVD, is a region known as the entry region or entry length. At the entrance of a tube or duct, viscous boundary layers begin to form along the tube walls with an inviscid core flow region initially separating the boundary layers. The boundary layers grow downstream until the flow fully develops and the inviscid core region disappears. According to the present invention, carrier 10 is placed within the inviscid core flow region during a CVD process.

For this aspect of the present invention, internal flow principles are used to establish the proper placement of carrier 10 within a reactor chamber. Under internal flow methods, the entrance length $L_e$ (i.e., the length required to achieve a fully developed flow) has been shown to correlate to the Reynolds number (Re) in laminar flow according to the following relationship:

$$\frac{L_e}{d} \approx 0.06 \, Re_d \qquad (3)$$

where d is the diameter of the tube. In turbulent flow, the boundary layers along the tube wall grow faster and $L_e$ is relatively shorter according the following relationship:

$$\frac{L_e}{d} \approx 4.4 \, Re_d^{1/6} \qquad (4)$$

where $Re_d$ is the Reynolds number calculated using the tube diameter (or hydraulic diameter for non-circular tubes).

Using equations 3 and 4, a preferred placement of carrier 10 within a reactor chamber can be achieved. For example, FIG. 7 illustrates a side view of a reactor chamber 51 having carrier 10 placed in a horizontal orientation within an inviscid core flow region 52. Inviscid core flow region 52 is bounded above and below by boundary layers 54 and 56 created by mainstream flow 57 and the sidewalls of reactor chamber 51.

Mainstream flow 57 and carrier 10 further create boundary layers 59 (over substrate 17) and 61. Arrow 62 represents the direct injection of one or more reactant species directly into boundary layer 59 for deposition of a thin film onto substrate 17.

One advantage of placing carrier 10 within inviscid core flow region 52 is that it replicates the conditions for external flow. This allows for much higher flow velocities to be utilized while maintaining laminar flow characteristics (i.e., higher laminar Reynolds numbers can be achieved). Also, by its location, substrate 17 is exposed to uniform flow velocities and is away from any interaction with boundary layers 54 and 56. This minimizes exposure to viscous effects that form at the walls of reactor chamber 51. Moreover, the high flow velocities result in thinner boundary layers over carrier 10 and substrates 17 (from equation 1). In turn, much higher mass transport characteristics for a CVD process result (from equation 2). This leads to much higher deposition rates and improved process control.

Although carrier 10 has been shown within inviscid core region 52 as a preferred embodiment, a bluff body substrate carrier (with or without an injection device) can be used to still take advantage of the uniform flow velocity. However, lower Reynolds number processes must be used to minimize turbulence effects.

Figure 8:
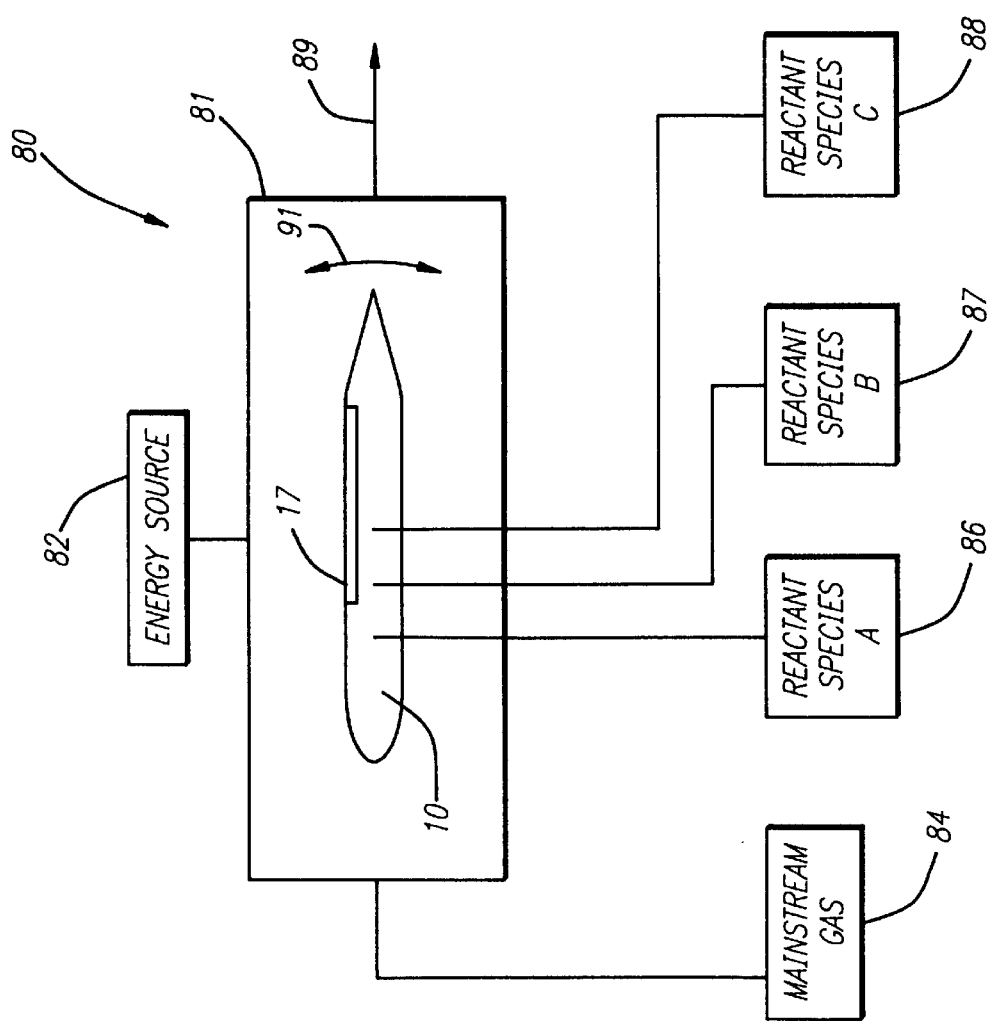
FIG. 8 is a schematic view of a reactor for use in a CVD process incorporating the substrate carrier of FIG. 1.

FIG. 8 illustrates a schematic view of a reactor 80 for use with a CVD process according to one embodiment of the present invention. Reactor 80 includes a reactor chamber 81 that contains carrier 10 and substrate 17. Carrier 10 preferably is close to the center of chamber 81 and is coupled to the sidewalls of chamber 81 in a way that allows carrier 10 to be rotated according to arrow 91. Such rotation allows for further process optimization.

Reactor 80 further includes an energy source 82 for heating substrate 17, a mainstream gas source 84, and one or more reactant species 86–88. To carry out a CVD process, substrate 17 is placed within chamber 81 and the appropriate pressure and temperature conditions are established. Mainstream gas 84 is introduced into chamber 81 at a predetermined flow rate to establish a boundary layer over substrate 17. Preferably, mainstream gas 84 is introduced into reactor chamber 81 at a velocity such that a Reynolds number greater than about 2000 is obtained to reduce the thickness of the boundary layer established over substrate 17.

Next reactant species 86–88 are mixed and injected into the boundary layer to absorb onto substrate 17 where they migrate and react to form the desired film. Excess gases leave chamber 81 through exhaust 89. Although carrier 10 is shown in a horizontal orientation, carrier 10 is suitable for vertical reactor designs as well.

By now it should be appreciated that structures and methods have been provided for improving gas flow characteristics and reactor efficiency in CVD processing. In particular, by using a substrate carrier having a non-bluff shape, higher laminar Reynolds number processes can be used. This improves, among other things, mass transfer characteristics. Additionally, by optionally adding a structure to directly inject reactant species into the boundary layer over substrates under process, improved process control, improved process efficiency, and reduced process costs are achieved. Furthermore, by optionally placing the substrate carrier in the inviscid core region of a reactor chamber, external flow conditions are replicated. This allows for much higher flow velocities to be utilized while maintaining laminar flow characteristics and the associated benefits of higher Reynolds number processes.

I claim:

1. A method for forming a thin film on a substrate comprising the steps of:
   placing a substrate onto a substrate holder within a reactor chamber, wherein the substrate holder has an airfoil profile;
   introducing a gas into the reactor chamber to establish a boundary layer over the substrate; and
   forming the thin film on the substrate.

2. The method of claim 1 wherein the step of placing the substrate onto the substrate holder includes placing the substrate onto the substrate holder comprising a leading edge, a trailing edge, a first major surface and a second major surface opposite the first major surface, wherein the leading edge is rounded and that portion of the substrate holder bounded by the first and second major surfaces has a thickness that varies between the leading edge and the trailing edge.

3. The method of claim 1 wherein the step of placing the substrate onto the substrate holder includes placing the substrate onto a substrate holder further including a device for injecting a reactant species into the boundary layer.

4. The method of claim 3 wherein the step of placing the substrate onto the substrate holder includes placing the substrate wherein the device for injecting the reactant species includes a spanwise slot.

5. The method of claim 3 wherein the step of forming the thin film includes depositing the thin film wherein at least one reactant species is injected into the boundary layer through the device.

6. The method of claim 3 wherein the step of forming the thin film includes depositing the thin film wherein the gas is non-reactive and wherein all reactant species are introduced into the reactor chamber through the device.

7. The method of claim 1 wherein the step of introducing the gas includes introducing a mainstream gas into the reactor chamber at a velocity such that a Reynolds number greater than about 2000 is obtained.

8. The method of claim 1 wherein the step of placing the substrate includes placing the substrate onto the substrate holder, wherein the substrate holder is positioned within the reactor chamber such that the substrate holder is within an inviscid core flow region when the gas is introduced into the reactor chamber.

9. A method for processing a substrate comprising the steps of:
   providing a reactor having a reactor chamber and a mainstream gas source;
   placing the substrate onto a susceptor within the reactor chamber, wherein the susceptor includes a device for injecting a reactant gas therefrom;
   introducing a mainstream gas into the reactor chamber from the mainstream gas source, wherein the mainstream gas provides a boundary layer over the substrate;
   introducing the reactant gas into the boundary layer through the device; and
   forming a thin film on the substrate from the reactant gas.

10. The method of claim 9 wherein the step of placing the substrate onto the susceptor includes placing the substrate onto the susceptor, wherein the susceptor comprises a streamlined shape with respect to flow of the mainstream gas.

11. The method of claim 10 wherein the step of placing the substrate onto the susceptor includes placing the substrate onto the susceptor, wherein the susceptor comprises a leading edge, a trailing edge, a first major surface, and a second major surface opposite the first major surface, and wherein that portion of the susceptor bounded by the first and second major surfaces has a thickness that varies between the leading edge and trailing edge.

12. The method of claim 9 wherein the step of placing the substrate includes placing the substrate onto the susceptor wherein the susceptor is placed within an inviscid core flow region of the reactor chamber.

13. A process for forming semiconductor devices on a substrate comprising the steps of:
   placing the substrate onto a carrier within a reactor chamber;

introducing a mainstream gas into the reactor chamber from a mainstream gas source, wherein the carrier is located within an inviscid core flow region of the reactor chamber when the mainstream gas is introduced, and wherein the mainstream gas creates a boundary layer over the carrier and the substrate; and forming a thin film on the substrate while the carrier is located within the inviscid core flow region.

14. The process of claim 13 wherein the step of placing the substrate onto the carrier includes placing the substrate onto the carrier, wherein the carrier comprises a major surface having a leading edge and a trailing edge, and wherein the major surface supports the substrate and wherein at least a portion of the major surface is curved between the leading edge and the trailing edge.

15. The process of claim 13 wherein the step of placing the substrate onto the carrier includes placing the substrate onto the carrier, wherein the carrier includes a device for injecting a reactant gas into the boundary layer and wherein the step of forming the thin film includes forming the thin film by injecting a reactant species into the boundary layer through the device.

16. The process of claim 15 wherein the step of forming the thin film includes forming the film from a plurality of reactant species injected into the boundary layer through the device.

17. A method for processing a substrate comprising the steps of:

placing the substrate onto a first major surface of a substrate carrier within a reaction chamber, wherein the first major surface has a leading edge and a trailing edge, and wherein at least a portion of the first major surface is curvilinear between the leading edge and the trailing edge;

introducing a gas into the reaction chamber to form a boundary layer over the substrate; and exposing the substrate to a reactant species.

18. The method of claim 17 wherein the step of placing the substrate includes placing the substrate onto a substrate carrier further including a device for injecting the reactant species into the boundary layer.

19. The method of claim 17 wherein the step of exposing the substrate to a reactant species includes exposing the substrate to a reactant species that contributes to formation of a film on the substrate.

20. A method for processing a substrate comprising the steps of:

providing a reactor device including a chamber and a gas source;

loading the substrate onto a carrier within the chamber, wherein the carrier includes a device for injecting a reactant species;

providing a gas into the chamber from the gas source thereby forming a boundary layer over the carrier; and injecting the reactant species into the boundary layer from the device.

21. The method of claim 20 wherein the step of loading the substrate onto the carrier includes loading the substrate onto a carrier having an airfoil profile.

22. The method of claim 20 wherein the step of loading the substrate including loading the substrate onto a carrier wherein the carrier is positioned within the chamber such that the carrier is within an inviscid core region when the gas is introduced into the chamber.

23. The method of claim 20 wherein the step of injecting the reactant species includes injecting a reactant species that contributes to formation of a layer on the substrate.

* * * * *